(12) United States Patent
Snyder

(10) Patent No.: US 8,084,693 B2
(45) Date of Patent: Dec. 27, 2011

(54) COMPONENT WITH BONDING ADHESIVE

(75) Inventor: Thomas Snyder, Cary, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 1041 days.

(21) Appl. No.: 11/939,804

(22) Filed: Nov. 14, 2007

(65) Prior Publication Data

US 2009/0119910 A1    May 14, 2009

(51) Int. Cl.
*H05K 1/16* (2006.01)

(52) U.S. Cl. .......................................... 174/260; 361/783

(58) Field of Classification Search .......... 174/259–260; 361/783
See application file for complete search history.

(56) References Cited

U.S. PATENT DOCUMENTS

| | | | |
|---|---|---|---|
| 4,489,487 A | 12/1984 | Bura | |
| 4,829,663 A | 5/1989 | Masujima et al. | |
| 6,228,197 B1 | 5/2001 | Wang | |
| 6,369,450 B1 | 4/2002 | Amani et al. | |
| 2004/0159462 A1 * | 8/2004 | Chung | 174/259 |
| 2007/0234561 A1 * | 10/2007 | Lin et al. | 29/832 |

FOREIGN PATENT DOCUMENTS

TW    200739848 A    10/2007

OTHER PUBLICATIONS

International Preliminary Report on Patentabilty, corresponding to International Patent Application No. PCT/US2008/065618, dated Feb. 12, 2010.
International Search Report, corresponding to International Patent Application No. PCT/US2008/065618, dated Oct. 16, 2008.
Written Opinion, corresponding to International Patent Application No. PCT/US2008/065618, dated Oct. 16, 2008.
European Patent Office; Examination Report; Oct. 25, 2010; issued in European Patent Application No. 08770022.5.
Korean Intellectual Property Office; Notice of Preliminary Rejection; Jun. 27, 2011; issued in Korean Patent Application No. 10-2010-7010559.
European Patent Office; Examination Report; Sep. 7, 2011; issued in European Patent Application No. 08770022.5.
State Intellectual Property Office, P.R. China; First Office Action; Oct. 13, 2011; issued in Chinese Patent Application No. 200880116237.9.

\* cited by examiner

*Primary Examiner* — Jeremy Norris
(74) *Attorney, Agent, or Firm* — Sreenivas Vedantam; Moore & Van Allen, PLLC

(57) ABSTRACT

A device comprising a component and an adhesive attached to at least one exterior portion of the component. When the component is on a printed circuit and passed through a reflow operation, the adhesive melts forming a physical bond between the component and the printed circuit. The printed circuit may be a flexible printed circuit or a printed circuit board. The adhesive may melt under and to at least one edge of the component. The adhesive may also melt under and to at least one edge of the component and under and to at least one edge of at least one second component adjacent to the component.

19 Claims, 5 Drawing Sheets

COMPONENT WITH BONDING ADHESIVE

BACKGROUND OF THE INVENTION

The present invention is related to components, and more specifically to a component with bonding adhesive.

As mobile phones and other portable electronic devices continue to get smaller and more complex, more and more traditional circuit boards are being replaced by flexible circuits. These flex circuits, even if held static or stable within the device, are more susceptible to damage to solder joints of mounted components breaking since the base material mounting the components is not rigid. While the use of stiffeners can provide some additional robustness, these are not always ideal due to cost or thickness concerns or the need for bending or movement from the flex itself. Underfill is another solution. The underfill helps facilitate bonding strength of the component to the board by adding more strength than electrical solder joints alone. As noted, for flex circuits, the need for strong bonds is even more important since there is no inherent stiffness in the circuit board itself to contribute to the strength of the component bonding. However, current underfill operations are very messy and require expensive specialized equipment in manufacturing, plus considerations in component layout to allow clearance for glue nozzles that must fit between components to discharge the underfill.

FIG. 1 shows a diagram of a typical component. This component represents a resistor where the component 100 includes an exterior surface 101 with multiple sides and contact portions 102 for connecting to a printed circuit via a solder joint. Therefore, the resistor component 100 would be mounted to a printed circuit via the contact portions 102.

FIG. 2 shows a diagram of a portion of a printed circuit board or flex tape circuit with mounted components. In the circuit board or flex tape circuit 200 portion, one or more components 201, 202, 203 may be mounted and electrically attached via solder joints (or any other electrical contact mechanisms) to the circuit board or flex tape circuit 200 portion. For example, component 201 represents a resistor and may include portions 204 at either end of the component 201 for making electrical connection with pads 205 on the printed circuit via a solder joint. The solder joints between the contact 204 and pad 205 bond the component 201 to the printed circuit 200.

BRIEF SUMMARY OF THE INVENTION

According to one aspect of the present invention, a device includes a component, and an adhesive attached to at least one exterior portion of the component, wherein when the component is on a printed circuit and passed through a heating operation, the adhesive melts forming a physical bond between the component and the printed circuit.

According to another aspect of the present invention, a method for forming a physical bond between a component and a printed circuit includes attaching an adhesive to at least one exterior portion of a component, placing the component on a printed circuit, and passing the printed circuit through a heating operation, wherein the adhesive melts responsive to the heating operation forming a physical bond between the component and the printed circuit.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION OF THE INVENTION

Figure 1:
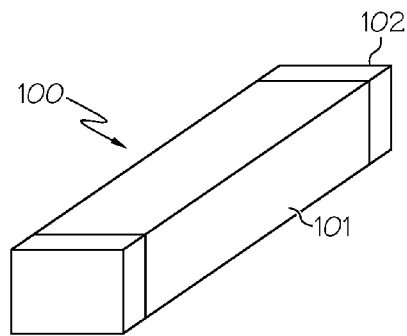
FIG. 1 is a diagram of a typical component.
Figure 2:
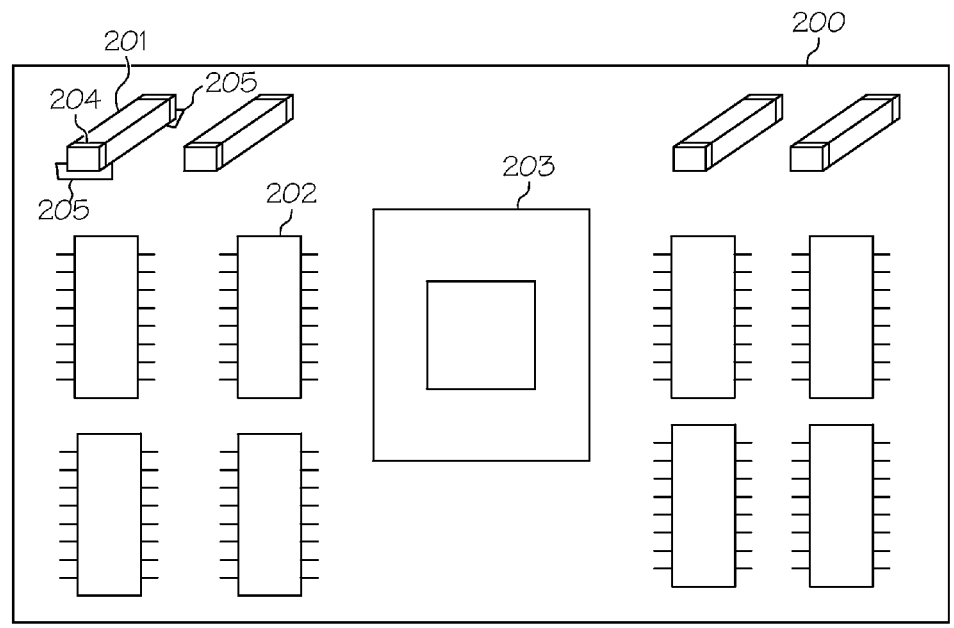
FIG. 2 is a diagram of a portion of a printed circuit board or flex tape circuit with mounted components.

According to embodiments of the present invention, a component to be mounted on a circuit board or flex circuit may come pre-packaged with an amount of releasable adhesive attached to an exterior of the component. The amount of adhesive may be small or large depending on the application or use of the component. The term "component" will be used to help illustrate embodiments of the present invention and may represent any type of component placed on or attached to a printed circuit such as, for example, an electrical component, an electromechanical component, an optical component, an audio component, a mechanical component, etc. Further the term "printed circuit" will be used to help illustrate embodiments of the present invention and may represent any type of printed circuit such as, for example, a printed circuit board or a flexible circuit (e.g., flexible tape circuit). Moreover, the term "heating operation" may represent any type of heating operation that may cause an adhesive and/or solder to melt (e.g., a reflow operation, a rework operation, a solder operation, an oven, etc.).

The adhesive may consist of an adhesive portion or dot on one or more sides of the component. The adhesive may be attached to the component at a manufacturer or distributor of the component. This may streamline the assembly process as the components with adhesive already attached may simply be supplied in the tubes from the manufacturer containing the components directly to the assembly machine or process. In addition, the adhesive may be attached to the component after receipt of the component from a manufacturer or distributor of the component and before a heating operation such as a reflow operation.

Standard equipment may be used to pick-and-place mount the component onto a printed circuit (e.g., flexible circuit or traditional circuit board) in a standard way where when the printed circuit passes through a heating operation (e.g., reflow operation) to melt and cure solder joints, at the same time, this adhesive melts causing the adhesive to form a bond with the component and the printed circuit. The adhesive may flow under and to the edges of the component by force of gravity and surface tension. The bond may be formed once the melted adhesive has hardened. For example, after coming out of the heating process (e.g., a reflow oven) the adhesive then rehardens, creating a physical bond between the component and the printed circuit in addition to the bond formed with the component and the printed circuit from hardening of the solder joints. Embodiments according to the present invention allow targeted underfill operations without a separate underfill process, without any specialized equipment, and without risk of inadvertently underfilling components where underfill is not desired. Further, no special placement considerations are required to make clearance for underfill equipment nozzles, therefore providing maximum design flexibility to a circuit designer.

According to embodiments of the present invention, the adhesive may be composed of a material having properties such that a normal surface tension in combination with gravity effects and surface energy effects (of the component, board, etc.) cause the adhesive to flow in one or more desired directions. Surface tension relates to a property of the adhesive material related to attraction or repulsion based on surface energy and surface geometry (e.g., of a component). Surface energy relates to the property of the component or circuit board material that makes it more receptive or less receptive to an adhesive bonding to the material. Further, according to embodiments of the present invention, an adhesive that is applied to an exterior surface of a component may have thermal properties that further support holding in or dissipating of heat. In addition, according to embodiments of the present invention, an adhesive attached to an exterior of a component may have insulating properties that further enhance insulating the component that the adhesive is applied to from electromagnetic fields, external temperatures, etc.

Moreover, components pre-packaged with adhesive attached in embodiments according to the present invention are advantageous in that "underfill" may occur on parts that are mounted inside a shield can. These parts may have no physical access at all for traditional underfill nozzles. This provides a solution where no options for underfill exist except to mount the component, underfill, them separately as an additional operation, and then mount the shield can. According to embodiments of the present invention, all steps may happen with just one pick-and-place operation and one heating operation.

Figure 3:
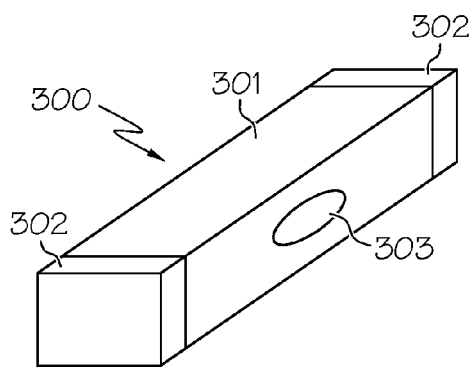
FIG. 3 is a diagram of a component with attached adhesive according to an example embodiment of the present invention.

FIG. 3 shows a diagram of a component with attached adhesive according to an example embodiment of the present invention. The diagram shows a component 300 that has an exterior surface 301 composed of multiple sides, and contacts 302 for electrical connection to a printed circuit. The component 300 further includes an adhesive 303 attached to one side of the exterior surface 301 of the component 300. The adhesive 303, when the component 300 is placed in a heating operation, melts and flows under and to the edges of the component 300 by force of gravity and surface tension. Upon coming out of the heating process (e.g., reflow process), the adhesive 303 re-hardens creating a physical bond between the component 300 and the printed circuit (e.g., printed circuit board or flex circuit). Although in this example embodiment, only one adhesive portion is shown on one side of the component 300, according to embodiments of the present invention, an adhesive portion may be attached to more than one side of the exterior 301 of the component 300. Further, multiple portions of adhesive 303 may be attached to one or more sides of an exterior 301 of a component 300.

Figure 4:
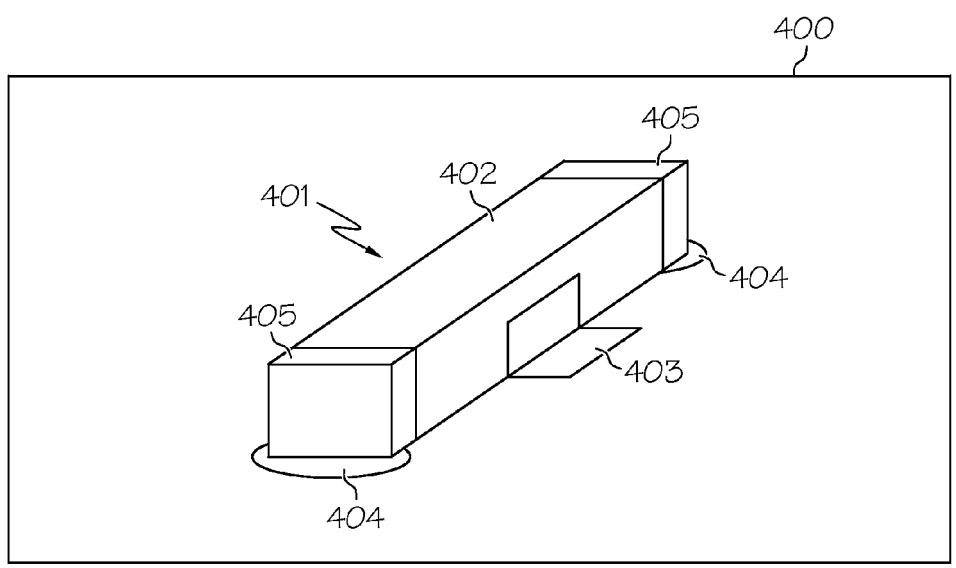
FIG. 4 is a diagram of a printed circuit with a component with attached adhesive according to an example embodiment of the present invention.

FIG. 4 shows a diagram of a printed circuit with a component with attached adhesive according to an example embodiment of the present invention. As noted previously, to help illustrate embodiments of the present invention, the term "printed circuit" will be used to represent a printed circuit on a printed circuit board as well as a printed circuit on a flexible tape. Therefore, the printed circuit 400 represents a portion of a printed circuit on a printed circuit board or on a flexible tape, and may include a component 401 that has an exterior 402 composed of one or more sides. The printed circuit 400 has been through a heating operation such as a reflow operation to melt and to cure solder joints between contacts 405 on the component 401 and pads 404 on the printed circuit 400. In this example embodiment, an adhesive portion 403 attached to a side of component 401 has melted during the heating operation and has flowed and hardened under component 401 and to the edges of the component 401 and onto the printed circuit 400 thereby creating a physical bond between the component 401 and the printed circuit 400. In this figure and other figures, although the adhesive is shown melted with straight-line edges, this is for illustrative purposes only and a melted adhesive may result in any typical shape or form normally occurring with a melted substance that flows under and to the sides of a component and hardens upon cooling, in view of gravity, surface tension and surface energy effects.

The adhesive 403 provides additional bonding of the component 401 to the printed circuit 400 in addition to solder joint connections that attach and provide electrical connection between the component 401 and circuits on the printed circuit 400. This additional bonding is advantageous for printed circuits on flexible tape where the flexible tape may move putting additional stresses upon the solder joints and bonding of the component 401 to the printed circuit 400.

Figure 5:
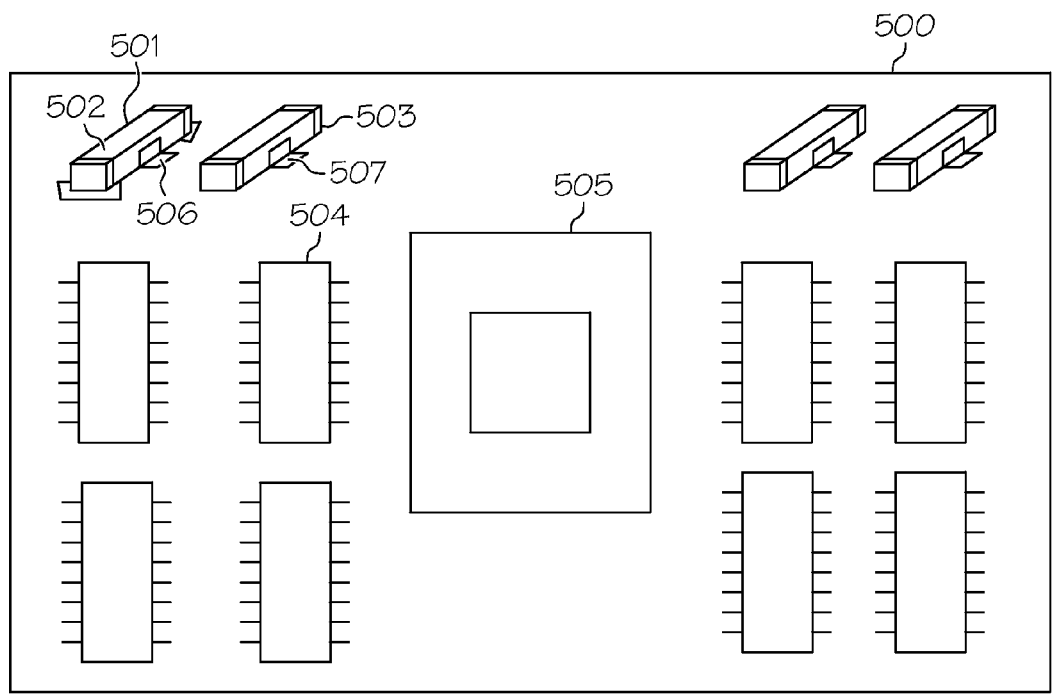
FIG. 5 is a diagram of a portion of a printed circuit with multiple components according to an example embodiment of the present invention.

FIG. 5 shows a diagram of a portion of a printed circuit with multiple components according to an example embodiment of the present invention. The printed circuit 500 may be a printed circuit board or flexible circuit and may include one or more components 501, 503, 504, 505 attached to the printed circuit 500. The printed circuit 500 in this example embodiment has been through a heating operation (e.g., a reflow operation) to melt and cure the solder joints (not shown) attaching the components 501, 503, 504 and 505 to the printed circuit 500. Components 501, 503 are shown where an adhesive 506, 507 on a side of each component 501, 503, respectively, has melted during the heating operation and has flowed and hardened under each component 501, 503 and to the sides of each component 501, 503 forming a bond of the components 501, 503 with the printed circuit 500.

Figure 6:
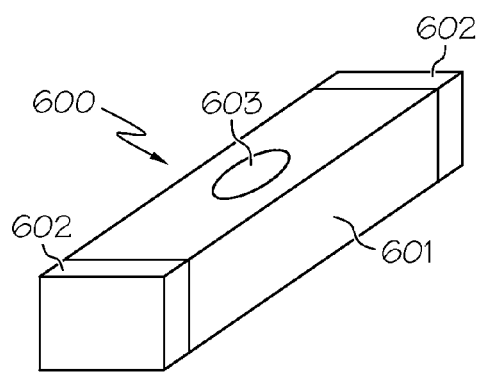
FIG. 6 is a diagram of component with an adhesive portion on a top of a component according to an example embodiment of the present invention.

FIG. 6 shows a diagram of component with an adhesive portion on a top of a component according to an example embodiment of the present invention. The component 600 may include an exterior portion composed of one or more sides 601 where an adhesive portion 603 may be attached to a top side of the component 600. The top being a side on the component 601 located opposite a side of the component closest to a printed circuit. The component 600 may also include one ore more contacts 602 for electrically connecting to a pad on a printed circuit. When the component 600 is passed through a heating operation, the adhesive portion 603 melts to the sides and underneath of the component 600 and onto the printed circuit forming a bond between the component 600 and the printed circuit.

Figure 7:
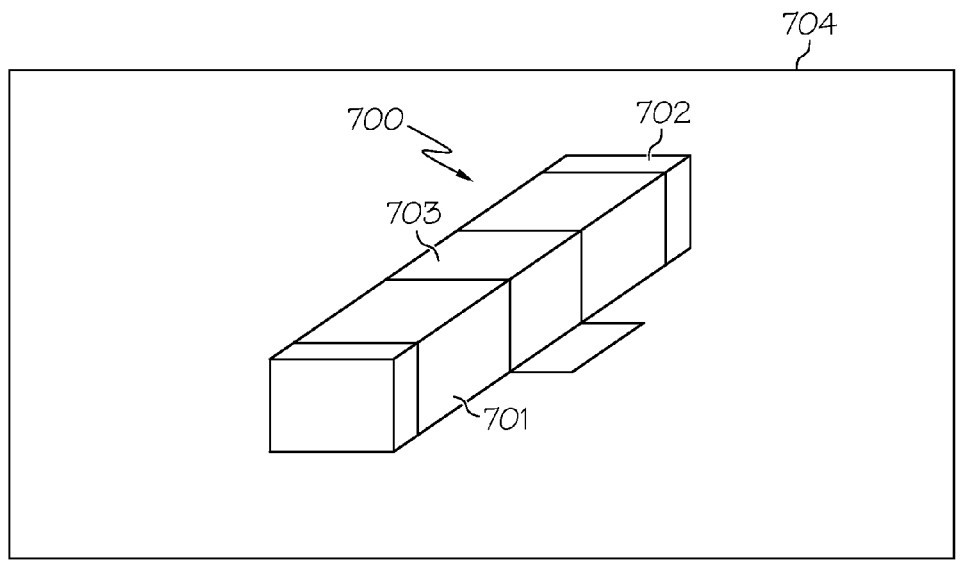
FIG. 7 is a diagram of a component with adhesive on top after a heating operation according to an example embodiment of the present invention.

FIG. 7 shows a diagram of a component with adhesive on top after a heating operation according to an example embodiment of the present invention. The component 700 may include an exterior portion 701 and one or more contacts 702. An adhesive portion 703 was originally on a top of the component 700 before a heating operation (e.g., a reflow operation). The top being a side on the component 700 located opposite a side of the component closest to a printed circuit portion 704. As a result of the heating operation, the adhesive portion 703 has melted and hardened around the sides and underneath of the component 700, and onto a surface of the printed circuit portion 704. In this example embodiment, the adhesive 703 has flowed down two opposite sides of the component 700.

Figure 8:
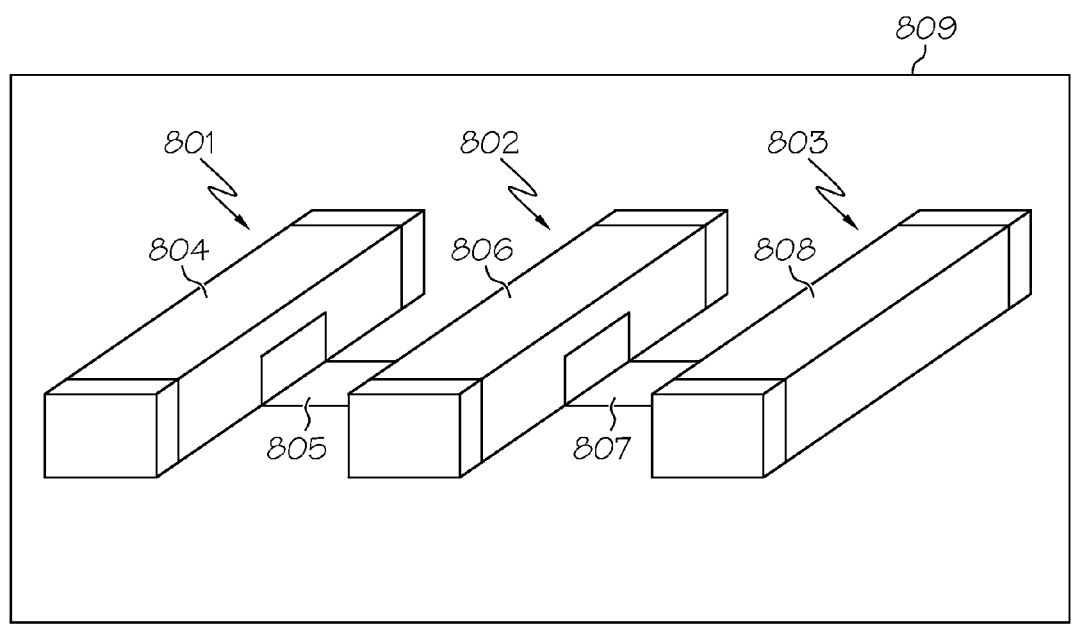
FIG. 8 is a diagram of adhesive attached to a component flowing to an adjacent component according to an example embodiment of the present invention.

FIG. 8 shows a diagram of adhesive attached to a component flowing to an adjacent component according to an example embodiment of the present invention. In this figure, multiple components 801, 802, 803 are shown where each component has an associated exterior portion 804, 806, 808, respectively. The three components 801, 802, 803 have been through a heating operation (e.g., a reflow operation). Before the heating operation, a first component 801 and a second component 802 may have had an adhesive attached to an exterior side of each component 801, 802. The first component 801, the second component 802, and a third component 803 may reside on a printed circuit 809 adjacent to each other. The first component 801 and the second component 802 may each have had a quantity of adhesive 805, 807 attached to the component such that, as shown in the figure, after the heating operation, the adhesive portion 805 on the first component 801 has melted and flowed along the side and under the first component 801 as well as along the side and under the second component 802. Further, the adhesive portion 807 attached to the second component 802 has melted and flowed along and underneath the side of the second component 802 as well as to the side and underneath the third component 803. Thus, according to embodiments of the present invention, a component may have enough adhesive attached to an exterior of the component such that after passing through a heating operation, the adhesive melts and not only forms a bond for the component with the adhesive attached but also forms a bond for an adjacent component attached to a printed circuit.

Figure 9:
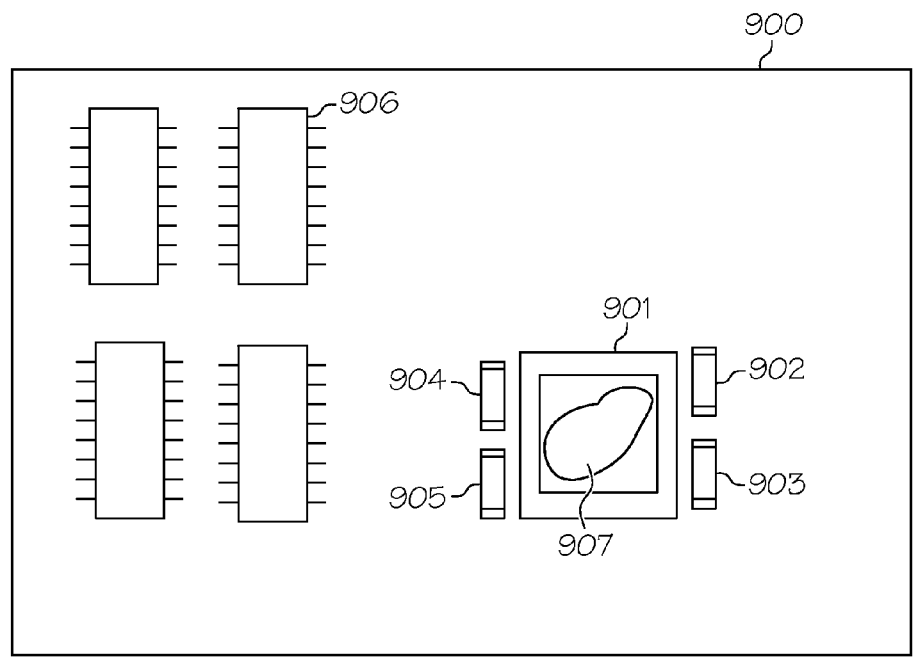
FIG. 9 is diagram of a component with a quantity of adhesive for bonding to adjacent components according to an example embodiment of the present invention.

FIG. 9 shows diagram of a component with a quantity of adhesive for bonding to adjacent components according to an example embodiment of the present invention. Printed circuit 900 may include one or more components 901-906 that are attached to the printed circuit 900. One or more of the components 901-906 may include an adhesive portion. In this example embodiment, only one component 901 includes an adhesive portion 907 attached to the component 901. The adhesive portion 907 attached to the component 901 is such that after the printed circuit has passed through a heating operation (e.g., a reflow operation), the adhesive portion 907 melts and flows around the component 901 that it is attached to as well as one or more adjacent components 902-905. The adhesive 907 may flow over the top and sides of the one component 901 and underneath and to the sides of the adjacent components 902-905.

Figure 10:
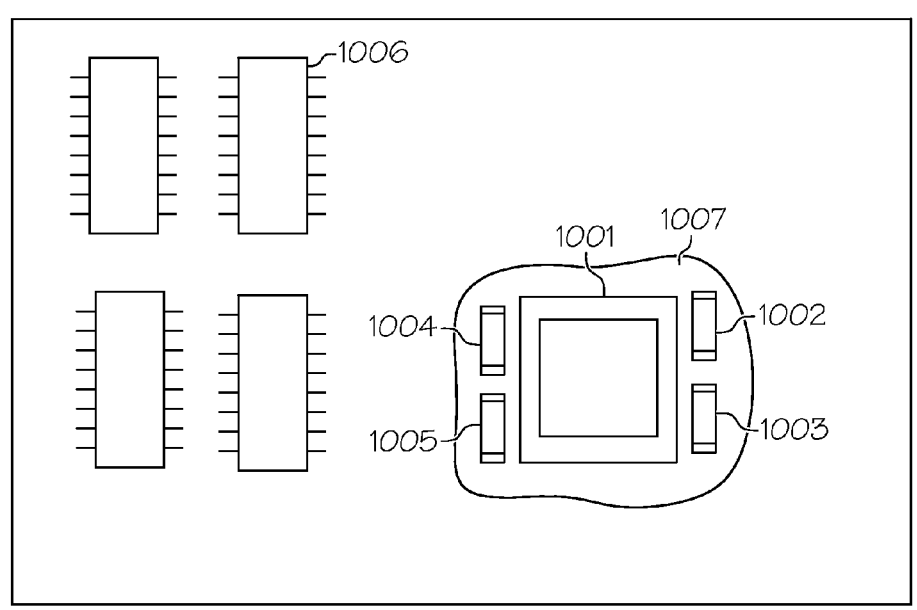
FIG. 10 is a diagram of a printed circuit after a heating operation with an adhesive around adjacent components according to an example embodiment of the present invention

FIG. 10 shows a diagram of a printed circuit after a heating operation with an adhesive around adjacent components according to an example embodiment of the present invention. A printed circuit 1000 may include one or more components, 1001-1006 mounted and attached to the printed circuit 1000. In this example embodiment, the printed circuit 1000 has been through a heating operation (e.g., reflow operation). A first component 1001 prior to passing through the reflow operation had an adhesive portion 1007 on a top of the first component 1001. The top being a side on the component 1001 located opposite a side of the component closest to the printed circuit 1000. As shown in the figure, due to the heating operation, the adhesive portion 1007 has melted from a top of the first component 1001 and has flowed around the component 1001 as well as around adjacent components 1002-1005. The adjacent components 1002-1005 may all be within a radius of the location of the first component 1001. The adhesive 1007 has flown around the adjacent components and hardened forming a bond with the first component 1001 and the printed circuit, as well as a bond with the adjacent components 1002-1005 and the printed circuit 1000. The adhesive 1007 may flow over the top and sides of the first component 1001 and underneath and to the sides of the adjacent components 1002-1005. Moreover, in embodiments according to the present invention, the adhesive 1007 may not be attached on a top of the first component 1001, but may be attached on one or more other exterior portions of the first component 1001 and flow around the first component 1001 as well as around adjacent components 1002-1005.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A device comprising:
    a component;
    at least one second component, the at least one second component being within a radius of the component;
    a printed circuit;
    an adhesive attached to at least one exterior portion of the component;
    wherein when the component is on the printed circuit and passed through a heating operation, the adhesive melts forming a physical bond between the component and the printed circuit; and
    wherein the adhesive melts under and to at least one edge of the component and under and to at least one edge of the at least one second component.

2. The device according to claim 1, wherein the printed circuit comprises one of a flexible printed circuit or a printed circuit board.

3. The device according to claim 1, wherein the heating operation comprises a reflow operation.

4. The device according to claim 1, wherein the adhesive melts under and to at least one edge of the component.

5. The device according to claim 1, wherein the adhesive is attached on at least one of a top of the component or at least one side of the component.

6. The device according to claim 1, wherein the adhesive is attached on a top of the component and melts down at least two sides of the component responsive to the reflow process.

7. The device according to claim 1, wherein the at least one second component is adjacent to the component.

8. The device according to claim 1, wherein the adhesive is attached to the component by at least one of a manufacturer of the component or a distributor of the component.

9. The device according to claim 1, wherein the adhesive is attached to the component after the component has been received from at least one of a manufacturer of the component or a distributor of the component.

10. The device according to claim 1, wherein the adhesive further comprises at least one of thermal properties that hold or dissipate heat or insulating properties that further enhance insulating the component from at least one of electromagnetic fields or external temperatures.

11. A method for forming a physical bond between a component and a printed circuit comprising:
    attaching an adhesive to at least one exterior portion of a component;
    placing the component on a printed circuit;
    placing at least one second component within a radius of the component;
    passing the printed circuit through a heating operation;
    wherein the adhesive melts responsive to the heating operation forming a physical bond between the component and the printed circuit; and
    wherein the adhesive melts under and to at least one edge of the component and under and to at least one edge of at least one second component.

12. The method according to claim 11, wherein the printed circuit comprises one of a flexible printed circuit or a printed circuit board.

13. The method according to claim 11, wherein the heating operation comprises a reflow operation.

14. The method according to claim 11, further comprising melting the adhesive under and to at least one edge of the component.

15. The method according to claim 11, further comprising attaching the adhesive on at least one of a top of the component or at least one side of the component.

16. The method according to claim 11, further comprising attaching the adhesive on a top of the component, the adhesive melting down at least two sides of the component responsive to the reflow process.

17. The method according to claim 11, wherein the at least one second component is adjacent to the component.

18. The method according to claim 11, further comprising attaching the adhesive to the component by at least one of a manufacturer of the component or a distributor of the component.

19. The method according to claim 11, further comprising attaching the adhesive to the component after the component has been received from at least one of a manufacturer of the component or a distributor of the component.

* * * * *